United States Patent
Damlencourt et al.

(10) Patent No.: US 7,972,971 B2
(45) Date of Patent: *Jul. 5, 2011

(54) METHOD FOR PRODUCING $SI_{1-y}GE_y$ BASED ZONES WITH DIFFERENT CONTENTS IN GE ON A SAME SUBSTRATE BY CONDENSATION OF GERMANIUM

(75) Inventors: Jean-Francois Damlencourt, Laval (FR); Yves Morand, Grenoble (FR); Laurent Clavelier, Grenoble (FR)

(73) Assignees: Commissariat A l'Energie Atomique, Paris (FR); STMicroelectronics SA, Montrouge (FR)

( * ) Notice: Subject to any disclaimer, the term of this patent is extended or adjusted under 35 U.S.C. 154(b) by 273 days.

This patent is subject to a terminal disclaimer.

(21) Appl. No.: 11/761,122

(22) Filed: Jun. 11, 2007

(65) Prior Publication Data
US 2007/0284625 A1 Dec. 13, 2007

(30) Foreign Application Priority Data
Jun. 12, 2006 (FR) .................................... 06 52094

(51) Int. Cl.
*H01L 21/31* (2006.01)
*H01L 21/469* (2006.01)

(52) U.S. Cl. ........ 438/758; 438/770; 438/478; 438/455; 438/222; 438/41; 438/226; 438/341; 438/369; 257/E21.182; 257/E21.132; 257/E21.133; 257/E21.102; 257/E21.662

(58) Field of Classification Search ................ 438/758, 438/431, 445, 552, 551, 770, 942, 945, 946; 257/E21.102, E21.132, E21.133
See application file for complete search history.

(56) References Cited

U.S. PATENT DOCUMENTS

| 5,091,339 | A | * | 2/1992 | Carey .............................. 216/18 |
| 5,374,564 | A | | 12/1994 | Bruel |
| 6,600,170 | B1 | | 7/2003 | Xiang |
| 6,867,128 | B2 | | 3/2005 | Deleonibus |
| 7,598,145 | B2 | * | 10/2009 | Damlencourt et al. ....... 438/285 |
| 2003/0075738 | A1 | * | 4/2003 | Chang ........................... 257/213 |

(Continued)

FOREIGN PATENT DOCUMENTS
WO  WO 2005/109509  11/2005

OTHER PUBLICATIONS

Tsutomu Tezuka, et al.; "High-Mobility Strained SiGe-on-Insulator pMOSFETs with Ge-Rich Surface Channels Fabricated by Local Condensation Technique"; IEEE Electron Device Letter, vol. 26, No. 4, Apr. 2005; pp. 243-245.

(Continued)

*Primary Examiner* — Charles D Garber
*Assistant Examiner* — Abdulfattah Mustapha
(74) *Attorney, Agent, or Firm* — Oblon, Spivak, McClelland, Maier & Neustadt, L.L.P.

(57) ABSTRACT

The disclosure relates to a method for producing a microelectronic device including a plurality of $Si_{1-y}Ge_y$ based semi-conducting zones (where $0<y\leq 1$) which have different respective Germanium contents, comprising the steps of:
  a) formation on a substrate covered with a plurality of $Si_{1-y}Ge_y$ based semi-conducting zones (where $0<x<1$ and $x<y$) and identical compositions, of at least one mask comprising a set of masking blocks, wherein the masking blocks respectively cover at least one semi-conducting zone of the said plurality of semi-conducting zones, wherein several of said masking blocks have different thicknesses and/or are based on different materials,
  b) oxidation of the semi-conducting zones of the said plurality of semi-conducting zones through said mask.

20 Claims, 7 Drawing Sheets

U.S. PATENT DOCUMENTS

| | | | |
|---|---|---|---|
| 2004/0000268 A1* | 1/2004 | Wu et al. | 117/94 |
| 2004/0075143 A1* | 4/2004 | Bae et al. | 257/347 |
| 2004/0178406 A1 | 9/2004 | Chu | |
| 2005/0098234 A1 | 5/2005 | Nakaharai et al. | |
| 2005/0269595 A1 | 12/2005 | Tezuka | |
| 2005/0282363 A1* | 12/2005 | Bai et al. | 438/478 |
| 2006/0197125 A1* | 9/2006 | Langdo et al. | 257/288 |
| 2007/0207598 A1 | 9/2007 | Damlencourt et al. | |

OTHER PUBLICATIONS

Tsutomu Tezuka, et al.; "A New Strained SOI/GOI Dual CMOS Technology Based on Local Condensation Technique"; 2005 Symposium on VLSI Technology Digest of Technical Papers, Jun. 2005; pp. 80-81.

Shu Nakaharai, et al.; "Characterization of 7-nm-Thick Strained Ge-on-Insulator Layer Fabricated by Ge-Condensation Technique"; Applied Physics Letters, vol. 83, No. 17, Oct. 2003; pp. 3516-3518.

L. K. Bera, et al.; "A Dual-Strained CMOS Structure Through Simultaneous Formation of Relaxed and Compressive Strained-SiGe-on-Insulator"; May 5, 2006; IEEE Electron Device Letters, vol. 27, No. 5, pp. 350-353.

Tsutomu Tezuka, et al.; "A Novel Fabrication Technique of Ultrathin and Relaxed SiGe Buffer Layers with High Ge Fraction for Sub-100 nm Strained Silicon-on Insulator MOSFETs"; 2005; Japanese Journal of Applied Physics, vol. 40, pp. 2866-2874.

Tsutomu Tezuka, et al.; "Selectively-formed High Mobility SiGe-on-Insulator pMOSFETs with Ge-rich Strained Surface Channels Using Local Condensation Technique"; 2004; Symposium on VLSI Technology, pp. 198-199.

Jingyun Huang, et al.; "Calculation of Critical Layer Thickness Considering Thermal Strain in $Si_{1-x}Ge_x$/Si Strained Layer Heterostructures"; 1998; Journal of Applied Physics, 83 (1), American Institute of Physics, pp. 171-173.

* cited by examiner

METHOD FOR PRODUCING $SI_{1-y}GE_y$ BASED ZONES WITH DIFFERENT CONTENTS IN GE ON A SAME SUBSTRATE BY CONDENSATION OF GERMANIUM

TECHNICAL FIELD

The invention relates to a method for producing an improved microelectronic device in which $Si_{1-y}Ge_y$ based semi-conductor blocks of different compositions are formed on a same substrate.

The invention may favour the integration, on a same semi-conductor substrate, or a same chip, or a same semi-conductor plate, simultaneously of a first plurality of transistors comprising an active layer based on a material that is optimised for the conduction of electrons and of a second plurality of transistors comprising an active layer based on a material that is optimised for the conduction of holes, wherein the performances of the transistors of the first plurality of transistors and the second plurality of transistors are equalised.

PRIOR ART

In the aim of improving the performances of the transistors, especially in terms of rapidity, there is a known technique of forming for the latter strained channels which have improved mobility for the electrons or holes. A strained channel is generally formed of at least one first semi-conductor layer based on a first semi-conductor material onto which a mechanical tensile or compressive strain is applied via another layer that is underlying or is located on the said first semi-conductor layer and for example based on a crystalline semi-conductor material that has a different mesh parameter from said first semi-conductor material. An appropriate semi-conductor material to favour good mobility of the holes often does not favour the mobility of the electrons. Consequently, a tensile or compressive strain applied onto a given semi-conductor material allows a greater increase in this material of the mobility of one type of carrier with respect to the other. For microelectronic devices such as CMOS technology circuits, including one or several transistors permitting main conduction by holes and one or several other transistors permitting main conduction by electrons, it is difficult to be able to increase, using strain channels, both the mobility of the load carriers for the N type transistors and for the P type transistors. In this type of circuit, it is furthermore generally preferable for the performances of the N type transistors and those of the P type transistors to be equalised in terms of current in the conductive state or in terms of mobility, which creates an additional difficulty. One solution consists of creating a microelectronic device equipped with semi-conducting zones based on different semi-conductor materials on a same substrate, and in particular semi-conducting zones based on a semi-conductor material favouring conduction by electrons and semi-conducting zones based on another semi-conductor material favouring conduction by holes.

The document U.S. Pat. No. 6,600,170 presents a creation on a solid semi-conductor substrate, with a semi-conducting zone with a Si based strained channel for a NMOS transistor and a semi-conducting zone with a Si based Ge or Ge strained channel for a PMOS transistor. Such architecture allows equalised performances to be obtained between the NMOS and PMOS transistors. Especially in terms of consumption, the performances of the transistors in such a structure are not optimal. Short channel effects as well as latching up may occur especially in the transistors.

The document FR 04 50889 presents a microelectronic method for producing active semi-conducting zones of different natures directly on an insulator. This method comprises steps consisting of: forming on a first substrate, of at least one first semi-conducting zone in one first crystalline semi-conductor material, and of at least one second semi-conducting zone in one second crystalline second semi-conductor material that is different from the first crystalline semi-conductor, then covering said first and second zones with an insulating thickness, then assembling a second substrate on said insulating thickness, then eliminating the first substrate. Such a method includes a large number of intermediate steps.

There is also the problem of finding a new microelectronic method for producing on a same substrate a set of semi-conducting zones of different compositions, including for example several semi-conducting zones based on a material favouring the conduction by electrons and several other semi-conducting zones based on a material favouring the conduction by holes.

DESCRIPTION OF THE INVENTION

The invention relates to a method for producing a microelectronic device including a plurality of based $Si_{1-y}Ge_y$ semi-conducting zones (where $0<y\leq1$) with different respective contents in Germanium.

In one aspect, the invention relates to a method comprising steps of:

a) formation on a substrate covered with a plurality of $Si_{1-x}Ge_x$ based semi-conducting zones (where $0<x<$ and $x<y$) and identical compositions, of at least one mask comprising a set of masking blocks, wherein the masking blocks respectively cover at least one semi-conducting zone of said plurality of semi-conducting zones, wherein several of said masking blocks have different thicknesses and/or are based on different materials, b) oxidation of the semi-conducting zones of said plurality of semi-conducting zones through said mask.

The masking blocks thicknesses and/or materials is designed to induce a delay with oxidation, this oxidation being carried out to lead to the formation of the aforesaid semiconducting zones containing $Si_{1-y}Ge_y$ (with $0<y\leq1$ wherein y>x) (y1, y2) with different respective Germanium contents under the aforementioned masking blocks. Hence, several formed masking blocks have thickness and a composition designed to induce a delay with oxidation, and not to prevent this oxidation.

The substrate may include a Si based thin layer on which the $Si_{1-y}Ge_y$ based semi-conducting zones rest. The Si based thin layer may be the layer resting on a buried oxide layer of a SOI substrate (silicon on insulator).

In one possibility, the mask may include a thin layer or a stack of thin layers including a set of holes, wherein at least several holes of the said set of holes have different depths.

In one possibility, the mask may include at least one hole revealing a $Si_{1-y}Ge_y$ based semi-conducting zone. Oxidation through the hole of a $Si_{1-x}Ge_x$ based semi-conducting zone may permit a semi-conducting zone with a high Germanium content to be obtained.

The mask may include at least one hole which reproduces a transistor channel pattern or a transistor gate pattern.

The method of the invention may permit several $Si_{1-y}Ge_y$ based transistor channel zones to be formed on a same substrate (where $0<y\leq1$) which have different respective Germanium contents.

In one possible embodiment, the mask may include at least one masking block based on one first dielectric material, and at least one second masking block based on one second dielectric material that is different from the first dielectric material.

In one variant, the mask may be based on at least one metallic or semi-conductor material.

In one possibility, the method may include, prior to step a):
formation of a perforated layer on the substrate including a plurality of holes,
formation in the holes of the perforated layer of $Si_{1-y}Ge_y$ based semi-conducting zones.

In another possibility, the $Si_{1-y}Ge_y$ based semi-conducting zones, may belong to a $Si_{1-y}Ge_y$ based semi-conductor layer formed or resting on the substrate.

In one possible embodiment, the mask may be in the form of at least one layer of variable thickness covering the $Si_{1-y}Ge_y$ based semi-conducting zones.

The upper face of the layer of variable thickness may produce an angle that is not nil with the main plane of the substrate.

The method of the invention may include, after step b), the steps of:
formation of at least one second mask that is different from the first mask,
oxidation of the semi-conducting zones through the second mask.

These two steps may be repeated with each time the formation of a new mask that is different from the previous one.

The method may further include after step b), the formation of a gate on one or several of the said $Si_{1-y}Ge_y$ based semi-conducting zones (where $0<y\leqq1$) with respective different Germanium contents.

In another aspect, the invention also relates to a method comprising the steps of:
a) formation on a plurality of Si based semi-conducting zones and with different thicknesses resting on a substrate, of a $Si_{1-x}Ge_x$ based semi-conductor layer (where $0<x<1$ and $x<y$),
b) oxidation of the $Si_{1-y}Ge_y$ based semi-conductor layer.

The Si based semi-conducting zones of different thicknesses may be zones of a Si based layer forming a bevel.

The form of the bevel of the Si based layer may be fabricated prior to step a) by:
formation of a mask in the form of a bevel on the Si based layer,
oxidation of the Si layer through the said mask in the form of a bevel,
removal of said mask in the form of a bevel.

The mask in the form of a bevel may be based on an insulating material, for example Si based $O_2$.

BRIEF DESCRIPTION OF THE DRAWINGS

This invention will be more clearly understood after reading the description of examples of embodiments provided purely by way of illustration and in no way restrictively, in reference to the appended drawings in which.

The various parts shown on the figures are not necessarily to a uniform scale, in order to make the figures easier to understand.

DETAILED DESCRIPTION OF SPECIFIC EMBODIMENTS

Figure 1A:
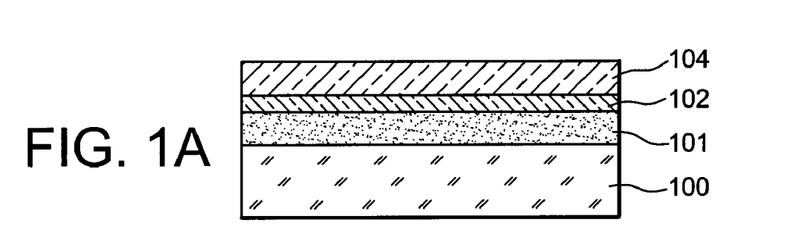
FIGS. 1A-1D, illustrate one example of a microelectronic method of the invention fabricated on a substrate, of several $Si_{1-y}Ge_y$ based semi-conducting zones (where $0<y\leqq1$) with different compositions of germanium, using at least one step of condensation of the Germanium carried out on a $Si_{1-y}Ge_y$ based layer (where $0<x<y<1$) protected by a mask of variable thickness.

An example of the method of the invention, the fabrication of a microelectronic device equipped with several $Si_{1-y}Ge_y$ based semi-conducting zones (where $0<y\leqq1$) with different respective compositions in Germanium formed on a same substrate, will now be provided in relation to FIGS. 1A to 1D. The starting material of this method may be a semi-conductor on insulator type substrate, for example of the SOI type (SOI for silicon on insulator) comprising a substrate layer 100 for example Si based, covered with a layer of dielectric material 101 for example a buried oxide layer that is itself covered with a thin semi-conductor layer 102 for example Si based, and with a thickness of between for example 5 and 100 nanometers or for example of around 20 nanometers. On the thin semi-conductor layer 102 another $Si_{1-x}Ge_x$ based semi-conductor layer 104, where $0<x<y\leqq1$, for example where x is around 0.1, with a thickness of between for example 50 and 300 or for example between 50 and 100 nanometers or for example between 40 and 75 nanometers is formed, for example by epitaxy (FIG. 1A).

Figure 1B:
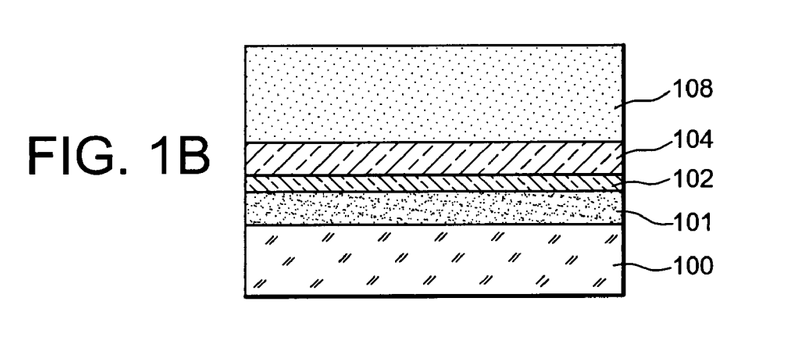

An oxidation mask is then fabricated on the $Si_{1-y}Ge_y$ based semi-conductor layer 104. The mask may be formed of at least one layer 108 which may be based on a dielectric material for example such as $SiO_2$ or $Si_3N_4$, or a stack of sub-layers of dielectric material(s), for example of a sub-layer based on a first dielectric material such as $Si_3N_4$, covered with another sub-layer based on a second dielectric material, for example such as $SiO_2$, or, in another example, a $SiO_2$ based sublayer, covered with a $Si_3N_4$ based sublayer. The masking layer 108 may be fabricated by deposition and may have a thickness for example of around 100 nanometers, or between for example 20 and 500 nanometers (FIG. 1B).

Figure 1C:
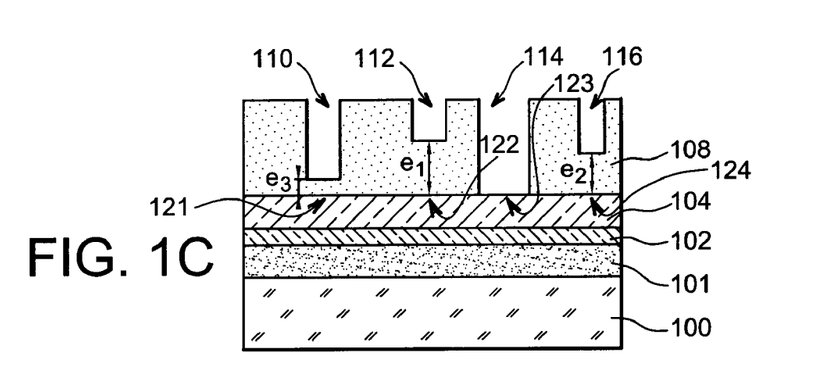

Subsequently, a set of holes 110, 112, 114, 116, is fabricated in the layer 108 of dielectric material or in the stack of layers of dielectric materials. The holes 110, 112, 114, 116, formed respectively have a given depth and respectively create a given pattern. Several of the holes 110, 112, 114, 116, formed in the masking layer 108 may have different depths and may create different patterns. The holes 110, 112, 114, 116, may be fabricated for example via a method comprising at least one photolithography or lithography step using an electron beam, or using a "nano-imprint" type method in which the holes 110, 112, 114, 116, are fabricated by stamping, using a stamp equipped with protruding patterns, and that is applied by pressing it on the layer 108 of dielectric material or on the stack of layers of dielectric materials. Certain holes 110, 112, 116, may have a bottom situated at the level of the masking layer 108 and reveal a portion of the latter. The masking layer 108 may also comprise one or several other holes 114 revealing the semi-conductor layer 104. The masking layer 108 equipped with holes 110, 112, 114, 116, of different depths forms a plurality of masking elements or masking blocks of different thicknesses resting on the semi-conductor layer 104 (FIG. 1C).

Subsequently, a localised condensation step of the Ge of the $Si_{1-x}Ge_x$ based semi-conductor layer 104 is carried out, for example using an oxidation method such as that described in the document: "A novel fabrication technique of ultrathin and relaxed SiGe buffer layers with high Ge fraction for sub-100 nm strained silicon on insulator MOSFETs, Tezuka and al., Japanese Journal of Applied Physics, vol. 40. p 2866-2874, 2001" or in the document "Selectively formed high mobility SiGe on Insulator pMOSFETs with Ge-rich strained surface channels using local condensation technique, Tezuka and al., Symposium on VLSI Technology, 2004". To carry out this condensation of the Ge, at least one heat treatment oxidation step of the $Si_{1-x}Ge_x$ based semi-conductor layer 104 is carried out at high temperature, and through the mask formed by masking blocks of different thicknesses. The oxidation temperature is preferably lower than the melting temperature of the $Si_{1-x}Ge_x$ material of the semi-conductor layer 104. Oxidation in one or several steps and at decreasing temperatures may be carried out.

During the oxidation step, the silicon of the thin semi-conductor layer 102, and the $Si_{1-x}Ge_x$ based layer 104, tend to be consumed, forming $SiO_2$. As the germanium is not or only slightly soluble in the $SiO_2$, it is rejected at the interface between the thin semi-conductor layer 102 and the buried oxide layer 101.

The masking elements or masking blocks of the layer 108, cause a delay in the oxidation of the semi-conductor layers 102 and 104, that is more or less long depending on their thicknesses respective. The oxidation of a first region 121 of the semi-conductor layer 104, located under a first masking block of a given first thickness $e_1$, is designed to be slower than that of a second region 122 of the semi-conductor layer 104, located under a second block of the layer 108 of a second thickness $e_2$ such that $e_2 \leq e_1$, which itself is designed to be slower than that of a third region 123 of the semi-conductor layer 104, located under a third block of the layer 108 of a third thickness $e_3$ such that $e_3 \leq e_2$, itself designed to be slower than a fourth region 124 of the layers 104, 108, located in the extension of a hole 114 revealing the semi-conductor layer 104.

The thicknesses $e_1$, $e_2$, $e_3$, are envisaged so that the masking blocks located respectively at the bottom of holes 110, 112, 114, 116, do not block oxidation. For that, the thicknesses $e_1$, $e_2$, $e_3$, are selected lower than 100 nanometers, in particular when layer 108 is containing $Si_3N_4$.

Figure 1D:
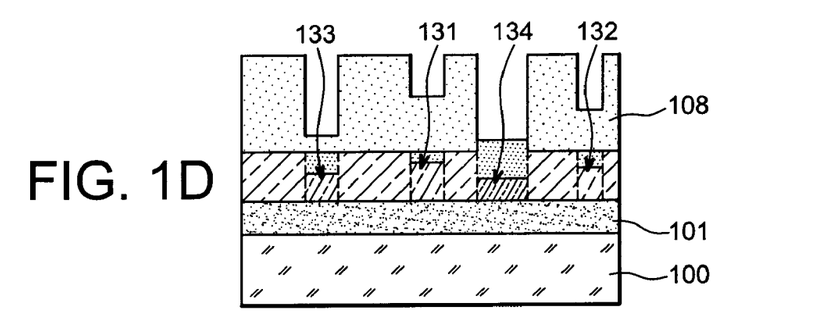

Once the oxidation step is complete, several $Si_{1-y}Ge_y$ based (where y>x) zones 131, 132, 133, 134 are obtained with respective compositions in Germanium or different respective Germanium contents. The duration of the oxidation step may need to be adapted to suit the concentration in Germanium desired in the different $Si_{1-y}Ge_y$ based semi-conducting zones. The first $Si_{1-y}Ge_y$ based zone 131, has a first composition in Germanium such that $y=y_1$, $y_1$ is for example around 0.1, while the second $Si_{1-y}Ge_y$ based zone, has a second composition in Germanium that is different from the first composition and such that $y=y_2$ where $y_2>y_1$, $y_2$ is for example around 0.4, the third $Si_{1-y}Ge_y$ based zone has a third composition in Germanium, that is different from the first and the second compositions, and such that $y=y_3$ where $y_3>y_2$, $y_2$ is for example around 0.7, the fourth $Si_{1-y}Ge_y$ based zone has a fourth composition in Germanium, that is different from the first, the second and the third composition such that $y=y_4$ where $y_4>y_3$, $y_4$ is for example around 1. As the $Si_{1-y}Ge_y$ based zones 131, 132, 133, 134 have different Germanium contents; they may be for example designed to serve respectively as a transistor channel zone. Once the oxidation step is complete, the $Si_{1-y}Ge_y$ based zones 131, 132, 133, 134 may be respectively covered by a $SiO_2$ based layer 135 formed during the oxidation. This layer 135 as well as the masking layer 108 may then be removed (FIG. 1D).

In one possible embodiment (not shown) of the method that we have just described, prior to the depositing of the masking layer 108, the $Si_{1-x}Ge_x$ based semi-conductor layer 104 may be covered by a thin Si based semi-conductor layer, for example with a thickness of between 1 and 5 nanometers. This thin semi-conductor layer may prevent the Germanium from being consumed during the oxidation step of the semi-conductor layer 104.

In the example of the method previously described, the material used to form the oxidation mask is a material that is capable of delaying the oxidation of the semi-conductor layer 104, and is not necessarily restricted to a dielectric material.

In one variant of the example of the method previously described, instead of forming a $Si_{1-x}Ge_x$ based semi-conductor layer 104, several semi-conductor distinct or disjointed $Si_{1-x}Ge_x$ based zones with identical compositions in Germanium are formed on the thin semi-conductor layer 102. Firstly, a masking layer 203 for example based on a dielectric material such as $Si_3N_4$ is deposited on the thin semi-conductor layer 102. The masking layer 203 may have a thickness for example of around 100 nanometers, or of between for example 50 and 400 nanometers.

Figure 2A:
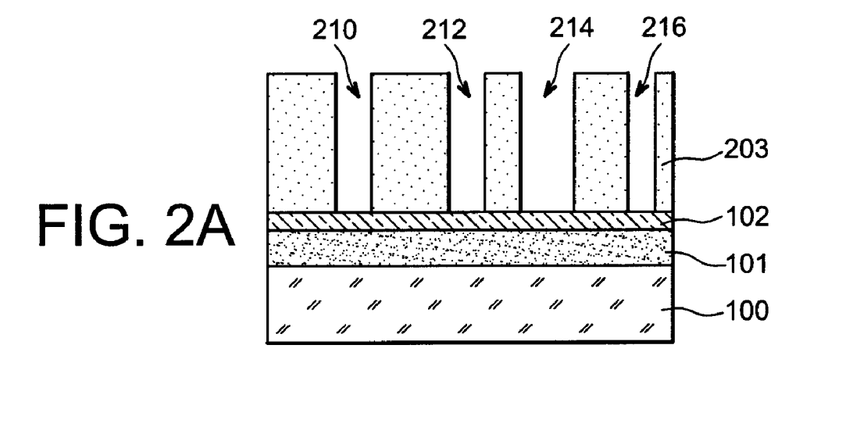
FIGS. 2A-2D, illustrate another example of a microelectronic method of the invention of the fabrication on a substrate, of several $Si_{1-y}Ge_y$ based semi-conducting zones (where $0<y\leqq1$) with different compositions of germanium, using at least one step of condensation of the Germanium carried out on $Si_{1-y}Ge_y$ based semi-conducting zones (where $0<x<y<1$) with identical compositions in germanium and protected by a mask of variable thickness.

In the masking layer 203, a set of holes 210, 212, 214, 216 is then fabricated, revealing the thin semi-conductor layer 102 (FIG. 2A). In one embodiment, the holes 210, 212, 214, 216, may respectively be in the form of a transistor gate or transistor channel.

Figure 2B:
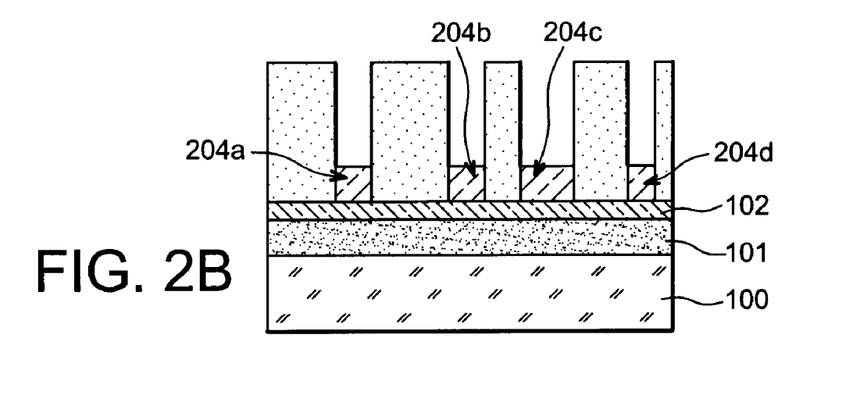

Subsequently, a set of semi-conductor $Si_{1-x}Ge_x$ based zones 204a, 204b, 204c, 204d, (where $0<x\leq1$, for example with x of around 0.1) is formed, for example by epitaxy at the bottom of the holes 210, 212, 214, 216, on the thin semi-conductor layer 102 (FIG. 2B).

Figure 2C:
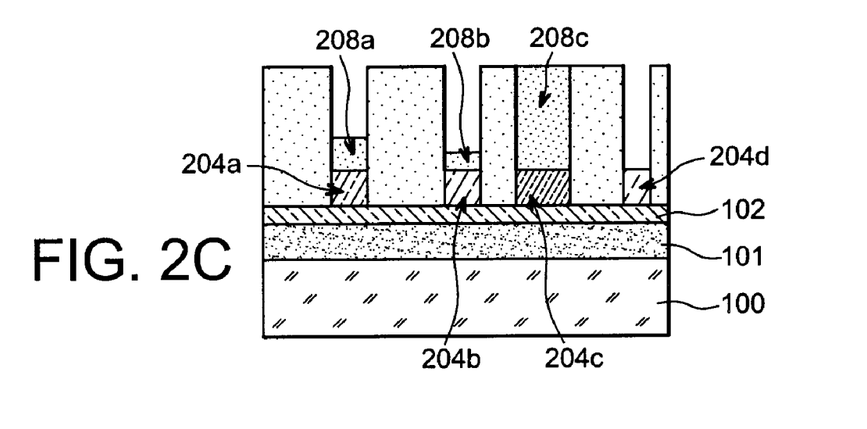

Then in several holes 210, 212, 214, of the said set of holes, on several zones 204a, 204b, 204c, of the said set of Si based semi-conducting zones Ge, a masking block is formed. A set of several masking blocks 208a, 208b, 208c, respectively filling one hole and covering one $Si_{1-x}Ge_x$ based semi-conducting zone is thus formed. The masking blocks 208a, 208b, 208c, may be for example based on a dielectric material such as for example $SiO_2$. Several masking blocks 208a, 208b, 208c, may have different thicknesses. The masking blocks 208a, 208b, 208c, may have a thickness of between for example 10 nm and 300 nm (FIG. 2C).

An oxidation step is carried out on the SiGe based zones 204a, 204b, 204c, 204d, at high temperature, through the mask formed by the perforated layer 203 and the masking blocks 208a, 208b, 208c, located in the holes. The oxidation step consumes the silicon of the thin semi-conductor layer 102, and the $Si_{1-y}Ge_y$ based zones 204a, 204b, 204c, 204d. The masking blocks 208a, 208b, 208c, depending on their respective thicknesses, are likely to delay the oxidation the oxidation of the semi-conductor layer 102 and the zones 204a, 204b, 204c, 204d. The respective thicknesses of the blocks 208a, 208b, 208c are envisaged so that these masking blocks do not prevent oxidation, but delay this oxidation.

Once the oxidation step is complete, several $Si_{1-y}Ge_y$ based zones 231, 232, 233, 234, are obtained with different respective compositions in Germanium, for example such that $0.1 \leq y \leq 1$. The $Si_{1-y}Ge_y$ based zones 231, 232, 233, 234 may be respectively covered by a $SiO_2$ based layer formed during oxidation.

Figure 2D:
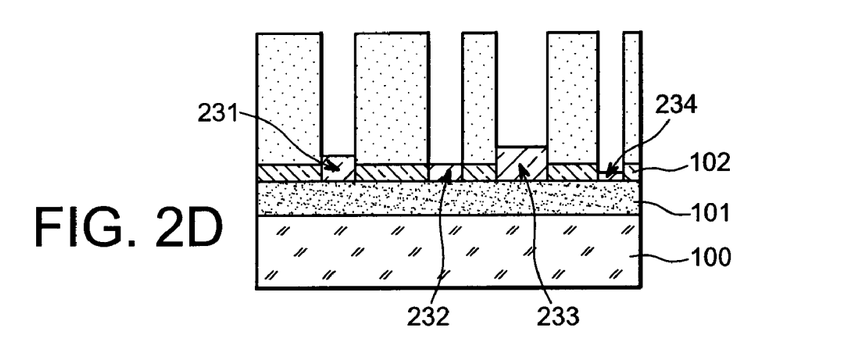

The masking blocks 208a, 208b, 208c, and the $SiO_2$ based layer formed during oxidation may then be removed. In the case where the layer 203 is to be kept, the removal may be carried out by selective etching of the layer 203. If for example the masking blocks 208a, 208b, 208c are $SiO_2$ based and the layer 203 is $Si_3N_4$ based the selective etching may be carried out wet using for example HF, or for example by plasma etching with $C_4F_8$ and a mixture of argon and oxygen (FIG. 2D).

In one possibility, the $Si_{1-y}Ge_y$ based zones 231, 232, 233, 234, with different respective compositions in Germanium may be respectively designed to form a transistor channel. Transistors equipped with $Si_{1-y}Ge_y$ based channel zones (where y>x) and different respective compositions in Germanium may thus be fabricated. To complete the formation of transistors, a gate may be made on each $Si_{1-y}Ge_y$ based zone 231, 232, 233, 234. To this end, following the removal of the masking blocks 208a, 208b, 208c, and the layer 235, a dielectric gate material, for example $HfO_2$, may be first deposited in the holes 210, 212, 214, 216, then at least one gate material, comprising for example at least one metallic material such as TiN and/or at least one semi-conductor material such as polysilicium, which may be highly doped, for example with Boron with a doping of around $10^{20}$ atoms/$cm^3$. The holes 210, 212, 214, 216 are filled by the gate material and this may then be followed by a CMP step (chemical mechanical polishing).

In one case for example where the $Si_{1-y}Ge_y$ based semi-conducting zones 231, 232, 233, 234, are formed with a high composition in Germanium, for example such that y is close to 1, the depositing of the dielectric gate material may be preceded by a step to form a $SiO_2$ based interface layer with a thickness for example of between 0.3 and 3 nanometers. The interface layer may be made for example by the growth of a thin Si layer on the $Si_{1-y}Ge_y$ based semi-conducting zones 231, 232, 233, 234 followed by oxidation of this thin Si layer.

Figure 3A:
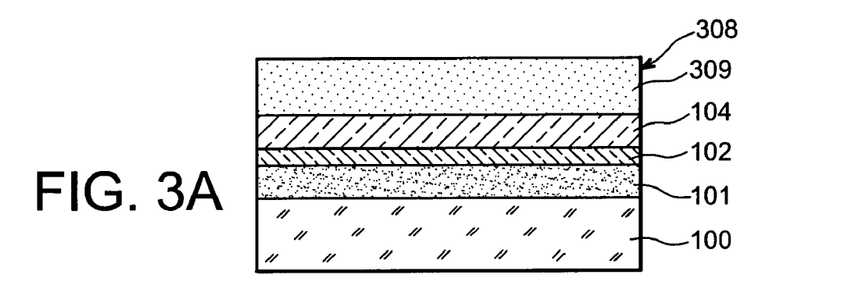
FIGS. 3A-3C, illustrate another example of the microelectronic method of the invention fabricated on a substrate, of several $Si_{1-y}Ge_y$ based semi-conducting zones (where $0<y\leqq1$) with different compositions of germanium, using at least one step of condensation of the Germanium carried out on a $Si_{1-y}Ge_y$ based layer (where $0<x<y<1$) protected by a mask in the form of a bevel.
Figure 3B:
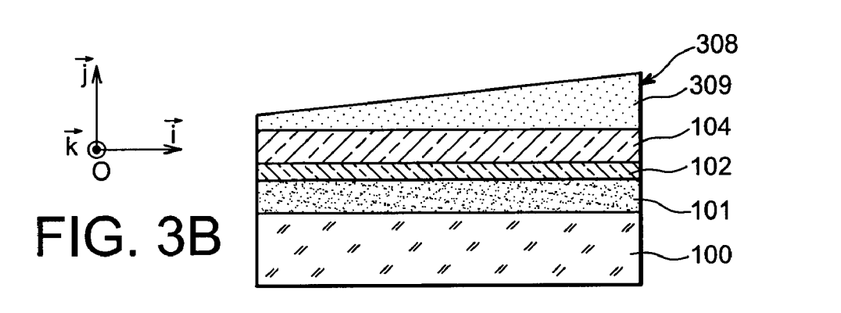

In another variant of the embodiment of the method previously described in relation to the FIGS. 1A-1D, a masking layer 308 based on a dielectric material 309, for example such as $SiO_2$, and with a thickness for example of between 20 nanometers and 1000 nanometers (FIG. 3A) may be deposited on the $Si_{1-x}Ge_x$ based semi-conductor layer 104. Subsequently, on the one hand the masking layer 308 is removed, so as to provide it with a form of a bevel. Following this removal, the upper face of the masking layer 308 creates an angle that is not nil with the main plane of the substrate 100 or forms an angled slope with respect to the main plane of the substrate 100 (the main plane of the substrate 100 is defined as a plane passing through the substrate 100 and parallel to the plane [O; $\vec{i}$; $\vec{k}$] with an orthogonal reference frame [O; $\vec{i}$; $\vec{j}$; $\vec{k}$]). In one case, for example, where the dielectric material 309 is $SiO_2$, the removal may be made for example by soaking the substrate covered by the masking layer 308, in a $HF+H_2O$ based solution, then by progressive removal of the solution (FIG. 3B).

Figure 3C:
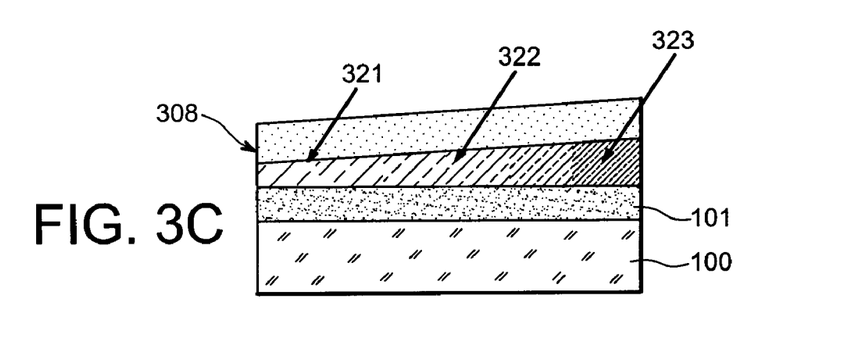
Figure 4A:
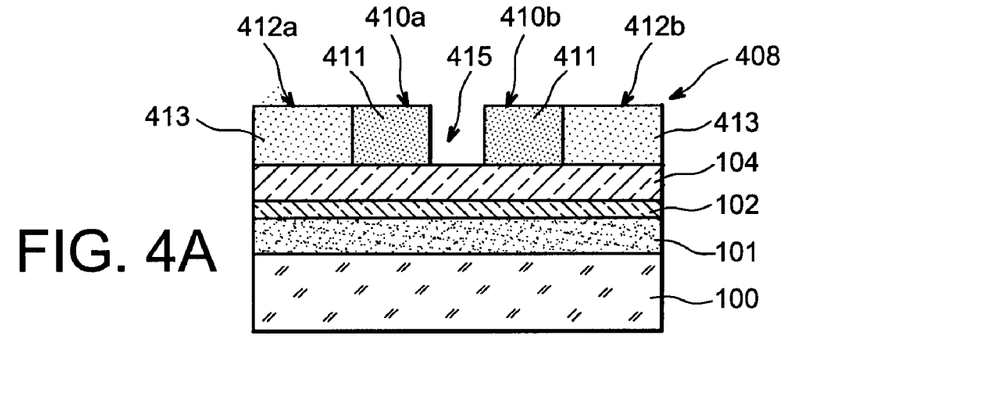
FIGS. 4A-4B, illustrate another example of the microelectronic method of the invention fabricated on a substrate, of several $Si_{1-y}Ge_y$ based semi-conducting zones (where $0<y\leqq1$) with different compositions of germanium, using at least one step of condensation of the Germanium carried out on a $Si_{1-y}Ge_y$ based layer (where $0<x<y<1$) protected by a mask formed by zones of different natures.

Subsequently, the semi-conductor layer 104 is oxidised at a high temperature similar to that described in one or other of the embodiments of method previously described. The layer 308 in the form of a bevel acts as a mask for this oxidation. Following this oxidation, between the masking layer 308 and the layer 104, $Si_{1-y}Ge_y$ based semi-conducting zones 331, 332, 333, (where y>x) that have different contents in Ge or different compositions in Germanium, are formed. A gradient of the concentration in Ge may be obtained in the semi-conductor thickness located between the insulating layer 101 and the masking layer, in a direction parallel to the main plane of the substrate 100. This gradient depends on the angle between the upper face of the masking layer 308 and the main plane of the substrate 100. In another embodiment of the method of the invention, a mask 408, comprising a plurality of blocks 410a, 410b, 412a, 412b, of which at least two blocks 410a, 412a, that have different compositions or are based on different materials, is made on the $Si_{1-x}Ge_x$ based semi-conductor layer 104. The mask 408 may be formed for example by several blocks 410a, 410b, based on a first material 411 that may be dielectric such as for example $SiO_2$ and several other blocks 412a, 412b, based on a second material 413 that may be dielectric such as for example $Si_3N_4$. In this example, the masking blocks 410a, 410b, 412a, 412b, may have identical thicknesses. The blocks 410a, 410b, based on the first dielectric material 411 and blocks 412a, 412b, based on the second dielectric material 413 may be made using a method comprising for example several steps of depositing and photolithography. The thicknesses of the blocks 412a, 412b, containing $Si_3N_4$ are envisaged so that these blocks of masking do not block completely or do not prevent oxidation completely. For that, the thickness of the blocks 412a, 412b, is selected lower than 100 nanometers when the latter are containing $Si_3N_4$ (FIG. 4A).

Subsequently, an oxidation step of the semi-conductor layer 104, such as that previously described, is carried out through the masking blocks 410a, 410b, 412a, 412b. Due to their different compositions, the masking blocks 410a, 410b, based on the first dielectric material cause a delay in the oxidation of the different semi-conductor layers 102 and 104, and for example less than that caused by the masking blocks 412a, 412b, based on the second dielectric material. During the oxidation step, the condensation of the Germanium and the consumption of the Silicon are much quicker in the zones of the semi-conductor layer 104 located opposite the masking blocks 410a, 410b based on the first dielectric material 411 than in other zones of the semi-conductor layer 104 located opposite masking blocks 412a, 412b based on the second dielectric material 413.

Figure 4B:
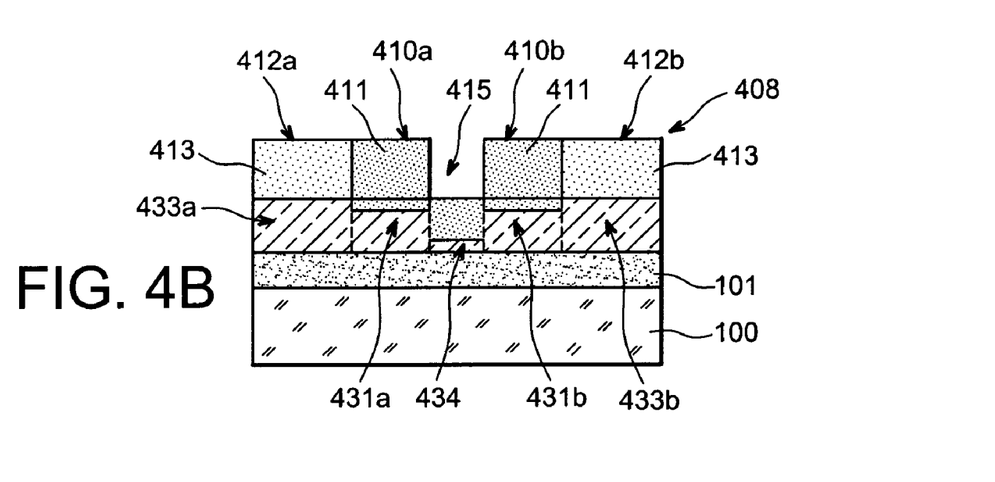

Following the oxidation, we obtain under the masking blocks 410a, 410b, based on the first dielectric material 411, $Si_{1-y}Ge_y$ based semi-conducting zones 431a, 431b, which have a first composition in Germanium, and a content in Germanium such that $y=y_1$ (where $y_1>x$), $y_1$ is for example around 0.8 to 1 under the masking blocks 412a, 412b based on the second material, other $Si_{1-y}Ge_y$ based semi-conducting zones 433a, 433b, which have a second composition in Germanium different from said first composition. The semi-conducting zones 433a, 433b located under the masking blocks based on the second dielectric material, may have a content in Germanium that is lower than that of the semi-conducting zones 431a, 431b located under the masking blocks based on the first dielectric material and such that $y=y_2$ (where $x<y_2<y_1$), $y_2$ is for example around 0.1 to 0.3 (FIG. 4B).

In one specific embodiment, in the case of the mask 408 further comprising at least one opening 415 revealing the semi-conductor layer 104 and for example which has a transistor gate pattern, following the oxidation, we obtain opposite the opening 415 a $Si_{1-y}Ge_y$ based semi-conducting zone 434, which has a third composition in Germanium, and a content in Germanium such that $y=y_3$ (where $x<y_2<y_3<y_1$).

In one variant, the oxidation mask may be formed of different materials, for example of blocks 410a, 410b based on a first dielectric material and blocks 412a, 412b based on a second material, that is metallic for example such as TiN.

Figure 5A:
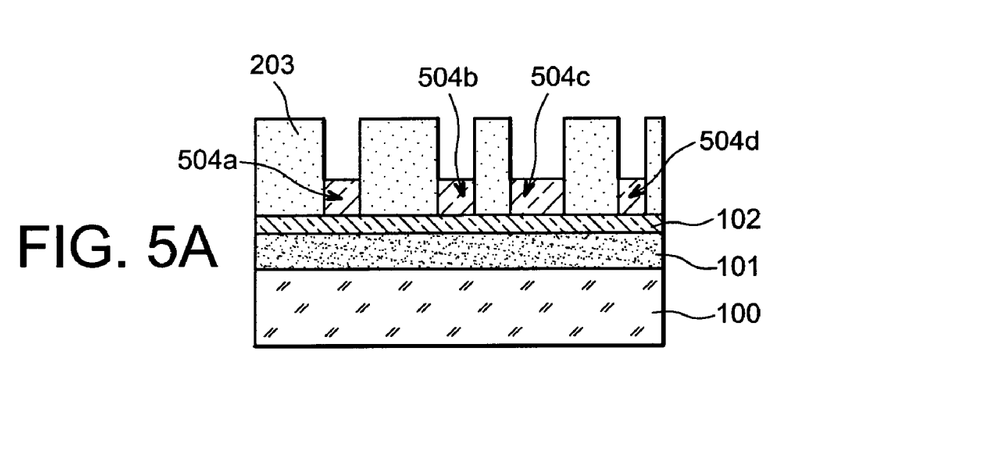
FIGS. 5A-5D, illustrate another example of the microelectronic method of the invention fabricated on a substrate, in which several oxidation steps of $Si_{1-y}Ge_y$ based semi-conducting zones are carried out, using a different mask each time.

Another variant of the embodiment of the method previously described in relation to FIGS. 2A-2D, will now be provided. For this variant, the masking layer 203 and the set of holes 210, 212, 214, 216, in this masking layer 203 are formed on the thin semi-conductor layer 102. Then a set of $Si_{1-x}Ge_x$ based semi-conducting zones 504a, 504b, 504c, 504d, (where $0<x\leq1$, for example with x of around 0.1) which has an identical content in Germanium is made, for example by epitaxy at the bottom of the holes 210, 212, 214, 216, on the thin Si based semi-conductor layer 102 (FIG. 5A).

Subsequently (FIG. 5B) a first set of masking blocks 508a, 508b, 508c is made, respectively filling one hole and covering a $Si_{1-x}Ge_x$ based semi-conducting zone. The masking blocks 508a, 508b, 508c, may be based on a dielectric material for example such as $Si_3N_4$. Among the $Si_{1-x}Ge_x$ based semi-conducting zones 504a, 504b, 504c, 504d, at least one semi-conducting zone 504c may be stripped bare or revealed and not be covered by a masking block.

Figure 5B:
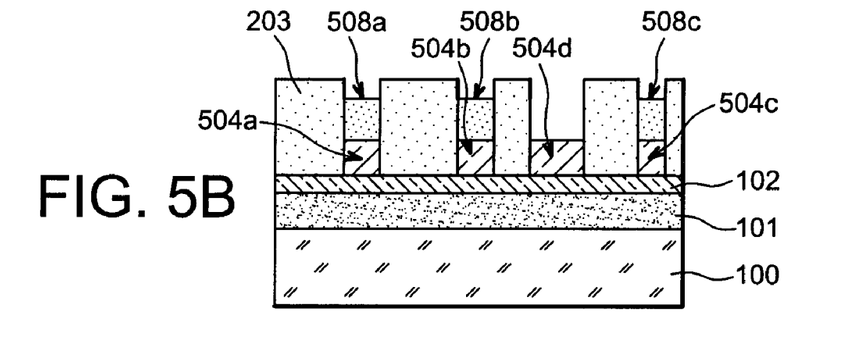

A first oxidation step of the semi-conducting zones 504a, 504b, 504c, 504d, is carried out at high temperature, through a first mask formed by the perforated layer 203 and the first set of masking blocks 508a, 508b, 508c. Depending on their respective thicknesses, the masking blocks 508a, 508b, 508c, cause a delay that is more or less long to the oxidation of the semi-conductor layer 102 and the semi-conducting zones 504a, 504b, 504c, 504d. Once the first oxidation step is complete, a first semi-conducting zone 504a located under a first masking block 508a, a second semi-conducting zone 504b located under a second masking block 508b, and a third semi-conducting zone 504c located under a third masking block 508c, have a different content in Germanium from that of a fourth semi-conducting zone 504d located in a hole 214 which does not have a masking block, and is revealed or stripped bare.

Figure 5C:
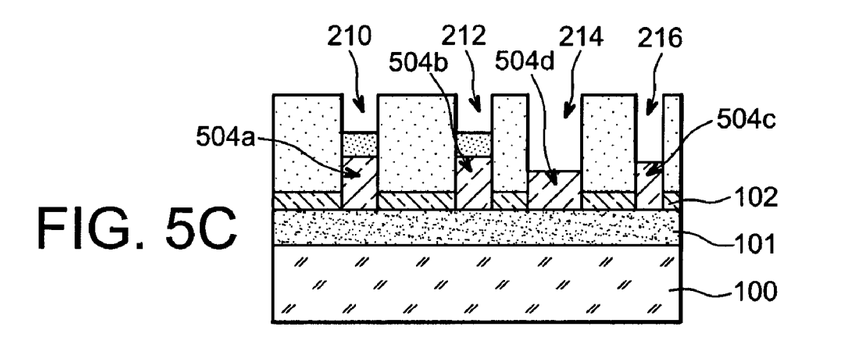
Figure 5D:
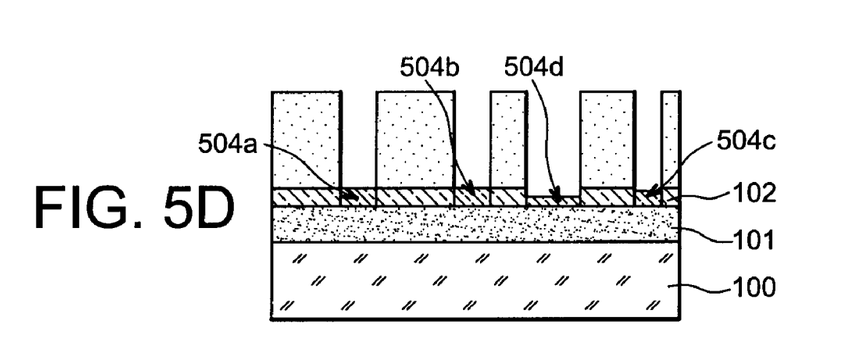

A second mask is then made. The second mask may be formed by a second set of masking blocks 518a, 518b, respectively filling one hole and covering respectively a $Si_{1-x}Ge_x$ based semi-conducting zone. The number of masking blocks 518a, 518b, of the second mask, is different from that of the first mask. The number of masking blocks of the second set of blocks 518a, 518b may be less than that of the first mask. The second mask may be such that at least one semi-conducting zone 504c that was located under a masking block 508c of the first mask is now revealed. The second mask may also be such that at least one semi-conducting zone 504d that was revealed during the first oxidation, remains revealed after the formation of the second mask. The second mask may be made by eliminating all of the blocks then by forming the new blocks or by elimination of one or several blocks of the first mask.

A second oxidation step of the zones 504a, 504b, 504c, 504d, is carried out at high temperature, through the second mask formed by the perforated layer 203 and the masking blocks 518a, 518b.

Once the second oxidation step is complete, the semi-conducting zones 504a, 504b, located respectively under the first masking block 508a, under the second masking block 508b, have a content in Germanium lower than that of the semi-conducting zones 504c, 504d revealed during the second oxidation. The content in Germanium of the semi-conducting zone 504d that was revealed during the first oxidation and the second oxidation, is higher than that of the semi-conducting zone 504c that was masked during the first oxidation and revealed during the second oxidation.

Another embodiment of the method of the invention, the creation of a microelectronic device equipped with several $Si_{1-y}Ge_y$ based semi-conducting zones (where $0<y\leq1$) which have different respective compositions in Germanium formed on a same substrate, will now be provided in relation to the FIGS. 6A to 6E. The starting material of the method may be a substrate of the semi-conductor on insulator type, for example SOI type (silicon on insulator) comprising a substrate layer 100 for example Si based, covered with a layer of dielectric material 101 for example a buried oxide layer, which itself is covered with a semi-conductor layer 602 for example Si based, and with a thickness of between for example 5 and 100 nanometers or for example around 20 nanometers.

Firstly the Si based zones of different thicknesses are fabricated on the substrate 100.

Figure 6A:
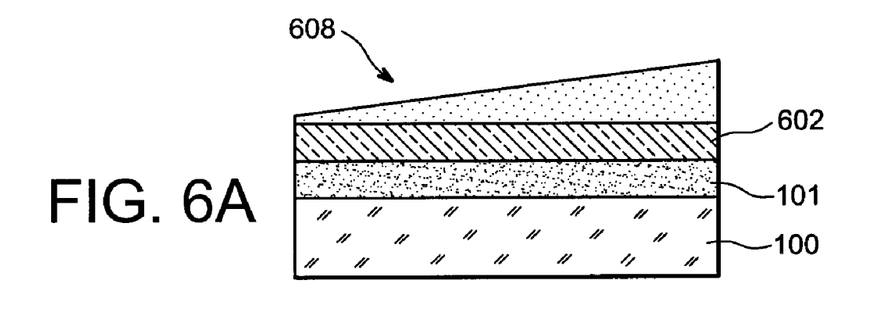
FIGS. 6A-6E, illustrate another example of the microelectronic method of the invention fabricated on a substrate, of several $Si_{1-y}Ge_y$ based semi-conducting zones (where $0<y\leqq1$) with different compositions of germanium, using at least one step of condensation of the Germanium carried out on a $Si_{1-y}Ge_y$ based layer (where $0<x<y<1$) in the form of a bevel, Identical, similar or equivalent parts of the different figures bear the same numerical references to make it easier to consult the various figures.

To this end, on the semi-conductor layer 602, a layer 608 may be formed that may be based on a dielectric material, such as for example $SiO_2$, and with a thickness for example of between 20 nanometers and 1000 nanometers. Subsequently, on the one hand the masking layer 608 is removed, so as to provide this layer 608 with a form of a bevel (FIG. 6A). After this removal, the upper face of the masking layer 608 forms an angle that is not nil with the main plane of the substrate 100 or forms an angled slope with respect to the main plane of the substrate 100 (wherein the main plane of the substrate 100 is defined as a plane passing through the substrate 100 and parallel to the plane $[O; \vec{i}; \vec{k}]$ with an orthogonal reference frame $[O; \vec{i}; \vec{j}; \vec{k}]$). In one case, for example, where the dielectric material of the layer 608 is $SiO_2$, the removal may be made for example by soaking the substrate covered by the masking layer 608, in a $HF+H_2O$ based solution, then by progressive removal of the solution.

Figure 6B:
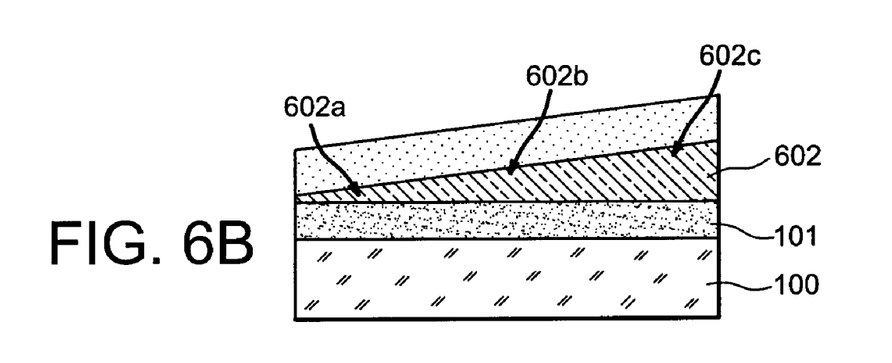

Subsequently, the semi-conductor layer 602 is oxidised, so as to provide a form of a bevel on the thin semi-conductor layer 102 (FIG. 6B). The bevel layer 602 thus comprises a plurality of Si based zones 602a, 602b, 602c of different thicknesses resting on the substrate 100.

Figure 6C:
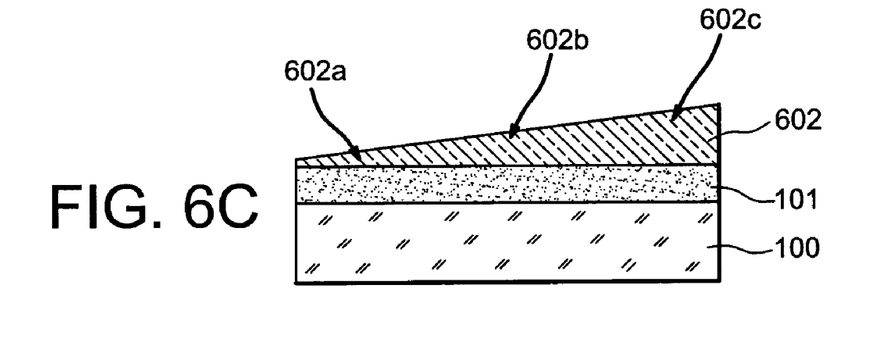

The masking layer 608 is then removed (FIG. 6C).

Figure 6D:
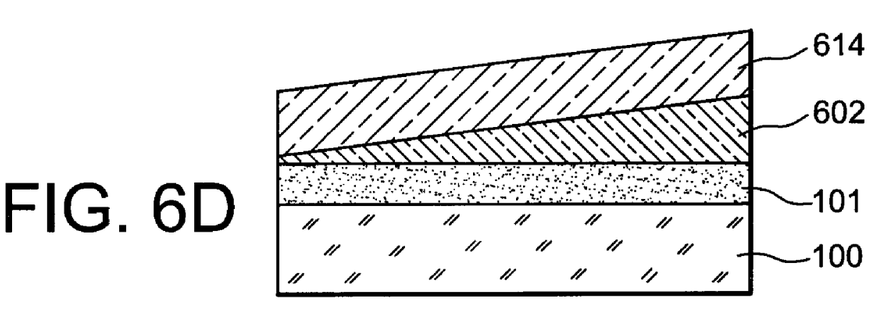
Figure 6E:
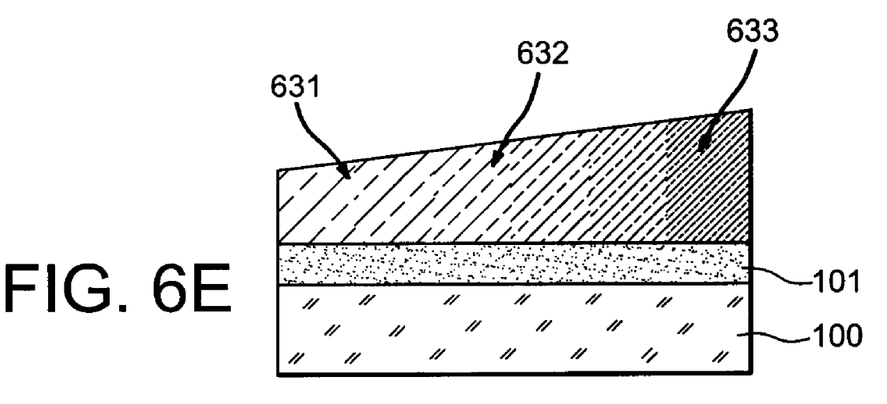

On the thin semi-conductor layer 102 another $Si_{1-x}Ge_x$ based semi-conductor layer 614, where $0<x<y\leq1$, for example where x is around 0.1, with a thickness of between for example 50 and 100 nanometers or for example between 40 and 75 nanometers is formed for example by epitaxy (FIG. 6D). Then a localised condensation step of the Ge is carried out on the $Si_{1-x}Ge_x$ based semi-conductor layer 614, for example using a heat treatment oxidation method such as that previously described. Following the oxidation or oxidations, $Si_{1-y}Ge_y$ based semi-conducting zones 631, 632, 633 (where $y>x$) and which have different contents in Ge or different compositions in Germanium are formed. A gradient of the concentration in Ge may be obtained, in a direction parallel to the main plane of the substrate 100. The semi-conducting zones 631, 632, 633 may be covered with a thin $SiO_2$ based insulating layer formed during the oxidation. This insulating layer may then be removed (FIG. 6E).

In one variant (not shown) of the embodiment that has just been described, Si based zones of different thicknesses may be fabricated by forming a mask including a plurality of openings revealing the silicon layer 102, then forming, for example by several epitaxies, silicon blocks of different thicknesses at the bottom of the openings. The $Si_{1-x}Ge_x$ based silicon blocks are then formed, where $0<x<y\leq1$, for example where x is around 0.1. Then, a heat treatment oxidation is carried out, such as that described above, on the $Si_{1-x}Ge_x$ based blocks. Following the oxidation or oxidations, $Si_{1-y}Ge_y$ based semi-conducting zones 631, 632, 633 (where y>x) with different contents in Ge or different compositions in Germanium are formed.

The invention claimed is:

1. A method for producing a microelectronic device comprising a plurality of $Si_{1-y}Ge_y$ based semi-conducting zones (where $0<y\leq1$) with different Germanium contents, comprising:
   a) forming at least one oxidation mask comprising a set of oxidation masking blocks on a substrate covered with a plurality of $Si_{1-x}Ge_x$ based semi-conducting zones (where $0<x<1$ and x<y) having identical compositions, wherein the oxidation masking blocks respectively cover at least one semi-conducting zone of said plurality of $Si_{1-x}Ge_x$ based semi-conducting zones, wherein a plurality of said oxidation masking blocks have different thicknesses different materials, or a combination thereof; and
   b) oxidizing said plurality of $Si_{1-x}Ge_x$ based semi-conducting zones through said oxidation mask, inducing a delay in the oxidation of said plurality of $Si_{1-x}Ge_x$ based semi-conducting zones as a function of the thicknesses and compositions of said oxidation masking blocks, and thereby forming $Si_{1-x}Ge_x$ based semi-conducting zones comprising $Si_{1-y}Ge_y$ (with $0<y<1$ wherein y>x) with different Germanium concentrations below said oxidation masking blocks.

2. The method according to claim 1, wherein the oxidation mask comprises a layer or a stack of layers comprising a set of holes, wherein at least several holes of the set of holes have different depths.

3. The method according to claim 2, wherein the oxidation mask comprises at least one hole revealing a $Si_{1-x}Ge_x$ based semi-conducting zone.

4. The method according to claim 1, wherein the oxidation mask comprises at least one masking block comprising a first dielectric material, and at least one second masking block comprising a second dielectric material different from the first dielectric material.

5. The method according to claim 1, wherein the oxidation mask comprises at least one metallic or semi-conductor material.

6. The method according to claim 1, comprising, prior to said a) forming at least one mask,
   forming a perforated layer on the substrate comprising a plurality of holes, and
   forming in the holes of the perforated layer, the $Si_{1-x}Ge_x$ based semi-conducting zones.

7. The method according to claim 1, wherein a $Si_{1-x}Ge_x$ based semi-conductor layer formed on the substrate comprises a plurality of $Si_{1-x}Ge_x$ based semi-conducting zones.

8. The method according to claim 1, wherein the oxidation mask comprises at least one layer of variable thickness covering the $Si_{1-x}Ge_x$ based semi-conducting zones.

9. The method according to claim 8, wherein the upper face of the layer of variable thickness forms an angle that is not nil with the main plane of the substrate.

10. The method according to claim 1, comprising, after said b) oxidizing said plurality of $Si_{1-x}Ge_x$ based semi-conducting zones,
    forming at least one second mask different from the first mask, and
    oxidizing said plurality of $Si_{1-x}Ge_x$ based semi-conducting zones through the second mask.

11. The method according to claim 1, wherein the substrate comprises a Si based layer on which the $Si_{1-x}Ge_x$ based semi-conducting zones rest.

12. The method according to claim 1, further comprising, after said b) oxidizing said plurality of $Si_{1-x}Ge_x$ based semi-conducting zones, forming a gate on one or more said semi-conducting zones.

13. The method according to claim 1 wherein a thickness of said mask ranges between 20 and 1000 nanometers.

14. The method according to claim 1 wherein a thickness of said mask is 100 nanometers.

15. The method according to claim 4 wherein said dielectric material is $Si_3N_4$.

16. The method according to claim 1, wherein said substrate is a thin Si layer.

17. The method according to claim 1, further comprising forming a $SiO_2$ layer on said plurality of $Si_{1-y}Ge_y$ based semi-conducting zones.

18. The method according to claim 17, wherein a thickness of said SiO2 layer ranges between 0.3 and 3 nanometers.

19. The method according to claim 1, comprising, prior to said a) forming at least one mask, forming a thin Si based semi-conductor layer on said plurality of $Si_{1-y}Ge_y$ based semi-conducting zones.

20. The method according to claim 19, wherein a thickness of the thin Si based semi-conductor layer ranges from 1 to 5 nanometers.

* * * * *